United States Patent [19]

Sato

[11] 4,438,529
[45] Mar. 20, 1984

[54] TV TUNER CIRCUIT

[75] Inventor: Takeshi Sato, Hirakata, Japan

[73] Assignee: Matsushita Electric Industrial Co., Ltd., Osaka, Japan

[21] Appl. No.: 337,857

[22] Filed: Jan. 7, 1982

[30] Foreign Application Priority Data

Jan. 8, 1981 [JP] Japan .................................. 56-1719

[51] Int. Cl.³ .............................................. H04B 1/16
[52] U.S. Cl. .................................... 455/190; 455/200; 455/176
[58] Field of Search ............... 455/176, 180, 188, 190, 455/200, 313, 333; 358/191.1

[56] References Cited

U.S. PATENT DOCUMENTS 4,048,598 9/1977 Knight ................................ 455/188
4,162,452 7/1979 Ash ..................................... 455/180

Primary Examiner—Jin F. Ng
Attorney, Agent, or Firm—Wenderoth, Lind & Ponack

[57] ABSTRACT

A TV tuner circuit having a dual-gate MES FET in a UHF RF amplifier and a dual-gate MOS FET in a VHF RF amplifier which are both controlled by a single AGC voltage source. The source of the MES FET is always connected to a DC source voltage input through a resistor so as to ensure that no DC current flows from an AG voltage source to the second gate of the dual-gate MPES FET in receiving VHF signals. Accordingly, there is no drop in the AGC voltage applied to the second gate of the dual-gate MOS FET in the VHF RF amplifier, thereby enabling both the UHF RF amplifier and the VHF RF amplifier to have the same gain reduction characteristics.

1 Claim, 5 Drawing Figures

TV TUNER CIRCUIT

BACKGROUND OF THE INVENTION

This invention relates to a TV tuner circuit having a dual-gate MES (Metal Semiconductor) FET in a UHF RF amplifier and a dual-gate MOS FET in a VHF RF amplifier which are both controlled by a single AGC voltage source. Though not an object of this invention, the TV tuner circuit using a dual-gate MES FET in UHF RF amplifier improves noise performance and cross modulation performance of the tuner.

In a prior art, a dual-gate MES FET in a UHF RF amplifier and a dual-gate MOS FET in a VHF RF amplifier are introduced into a conventional tuner circuit.

An AGC voltage is always applied to both the second gate of the dual-gate MES FET and that of the dual-gate MOS FET. In receiving UHF signals, DC bias voltages are applied to the source, the first gate and the drain of the dual-gate MES FET through resistors from a power supply source. But no DC bias voltage are applied to the dual-gate MOS FET in the VHF amplifier. In receiving VHF signals, DC bias voltages are applied to the source, the first gate and the drain of the dual-gate MOS FET through resistors from the power supply source. But no DC bias voltages are applied to the source, the first gate and the drain of the dual-gate MES FET.

Therefore, in this prior art tuner, the voltage between the source and the second gate of the dual-gate MES FET becomes so high that a DC current is obliged to flow from the AGC voltage source in the VIF circuit to the second gate of the dual-gate MES FET in receiving VHF signals.

Due to the internal resistance of the AGC voltage source, the AGC voltage applied to the second gate of the dual-gate MOS FET in the VHF RF amplifier drops in comparison with that of the dual-gate MES FET in the UHF RF amplifier (with the same input signal strength of UHF and VHF signals).

The input signal strength at which the gain reduction of the VHF RF amplifier starts will not be the same as that at which that of the UHF RF amplifier starts.

SUMMARY OF THE INVENTION

It is an object of the present invention to provide a TV tuner circuit with the same gain reduction characteristics for both its VHF RF and UHF RF amplifiers.

BRIEF DESCRIPTION OF THE DRAWINGS

Hereinafter, the present invention will be detailed with the accompanying drawings in which.

DESCRIPTION OF THE PREFERRED EMBODIMENT

Figure 1:
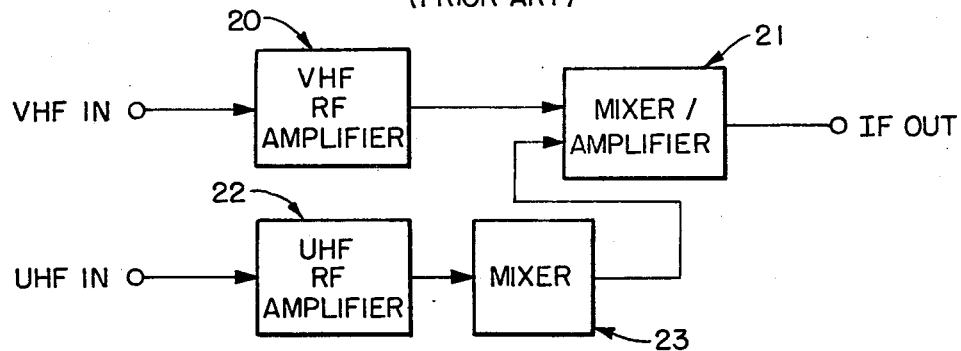
FIG. 1 is a block diagram of a conventional tuner circuit.

FIG. 1 is a block diagram of a conventional tuner circuit. Referring first to the conventional tuner circuit in FIG. 1, this tuner circuit comprises a VHF RF amplifier 20, a VHF mixer (or IF amplifier) 21, a UHF RF amplifier 22 and a UHF mixer 23. The VHF input signal is amplified by the VHF RF amplifier 20 and is converted into an IF output signal by VHF mixer 21. The UHF input signal is amplified by the UHF RF amplifier 22 and is converted into an IF output signal by UHF mixer 23. In receiving UHF signals, the VHF mixer 21 is used as an IF amplifier so that the IF output signal is amplified by IF amplifier 21.

Figure 2:
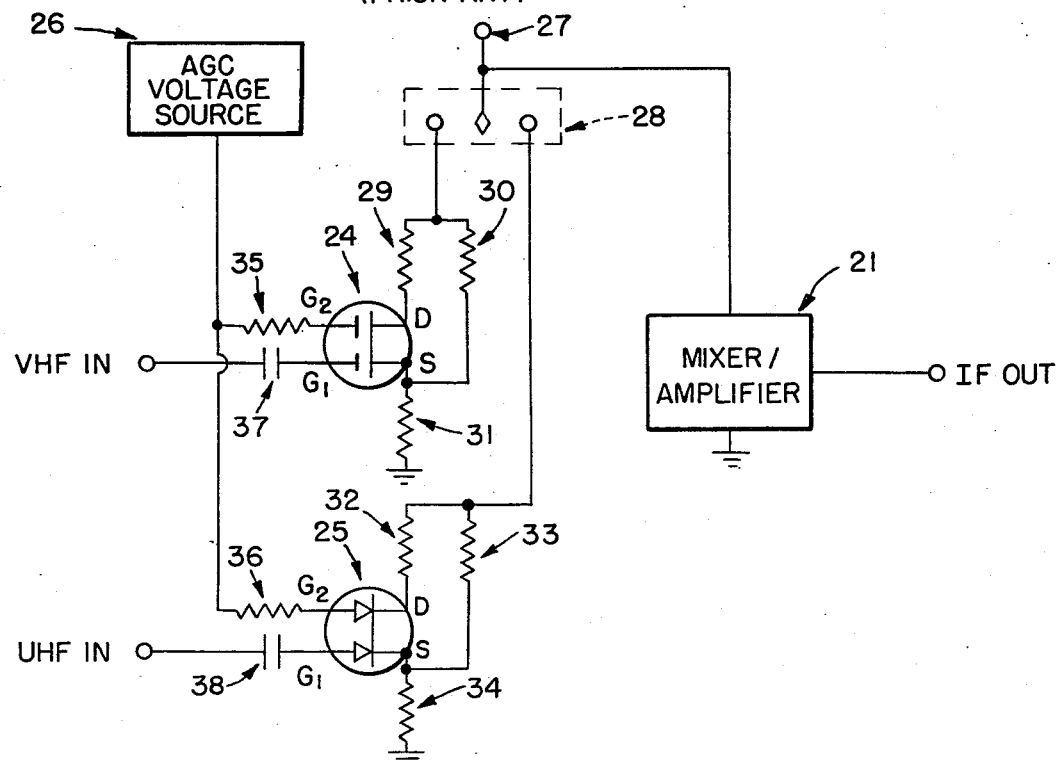
FIG. 2 is a circuit diagram of conventional RF amplifiers.

FIG. 2 shows a circuit diagram of a conventional TV tuner having both UHF and VHF RF amplifiers. A dual-gate MOS FET 24 and a dual-gate MES FET 25 are used in the VHF RF amplifier and the UHF RF amplifier, respectively. Input signals are applied to the first gates ($G_1$) of a dual-gate MOS FET 24 and a dual-gate MES FET 25 through the respective coupling capacitors 37 and 38. The AGC voltage is applied to the second gates ($G_2$) of a dual-gate MOS FET 24 and a dual-gate MES FET 25 through respective resistors 35 and 36 from the AGC voltage source 26 included in the VIF circuit. In receiving UHF signals, the drain (D) of the dual-gate MES FET 25 is connected to the power supply source 27 through a DC switch 28. UHF input signals are amplified by the dual-gate MES FET 25 with resistors 32, 33 and 34 used for DC bias. In receiving VHF signals, the drain (D) of the dual-gate MOS FET 24 is connected to the power supply source 27 through the DC switch 28. VHF input signals are amplified by the dual-gate MOS FET 24 with resistors 29, 30 and 31 used for DC bias. But no DC bias voltage is supplied to the dual-gate MES FET 25 in the UHF amplifier except for the AGC voltage by the DC switch 28. Therefore, the voltage supplied between the source (S) and the second gate ($G_2$) of the dual-gate MES FET 25 becomes so high that the DC current is obliged to flow through resistor 36 from the AGC voltage source 26 to the second gate ($G_2$) of the dual-gate MES FET 25.

Figure 3:
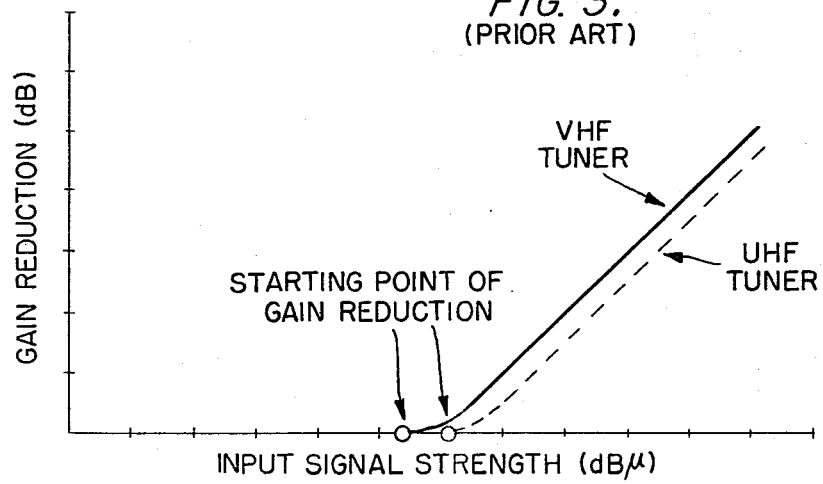
FIG. 3 is a graph showing the gain reduction characteristics of a conventional tuner circuit.

FIG. 3 illustrates the gain reduction characteristics of the conventional tuner circuit shown in FIG. 2. In FIG. 3, the dotted curve shows the gain reduction characteristics of the conventional UHF tuner versus the input signal strength. The solid curve indicates the gain reduction characteristics of the conventional VHF tuner versus the input signal strength. The gain reduction characteristic of the conventional UHF tuner does not coincide with that of the conventional VHF tuner and the signal strength of the conventional VHF tuner at which the gain reduction starts is always lower than that at which that of the conventional UHF tuner starts.

Figure 4:
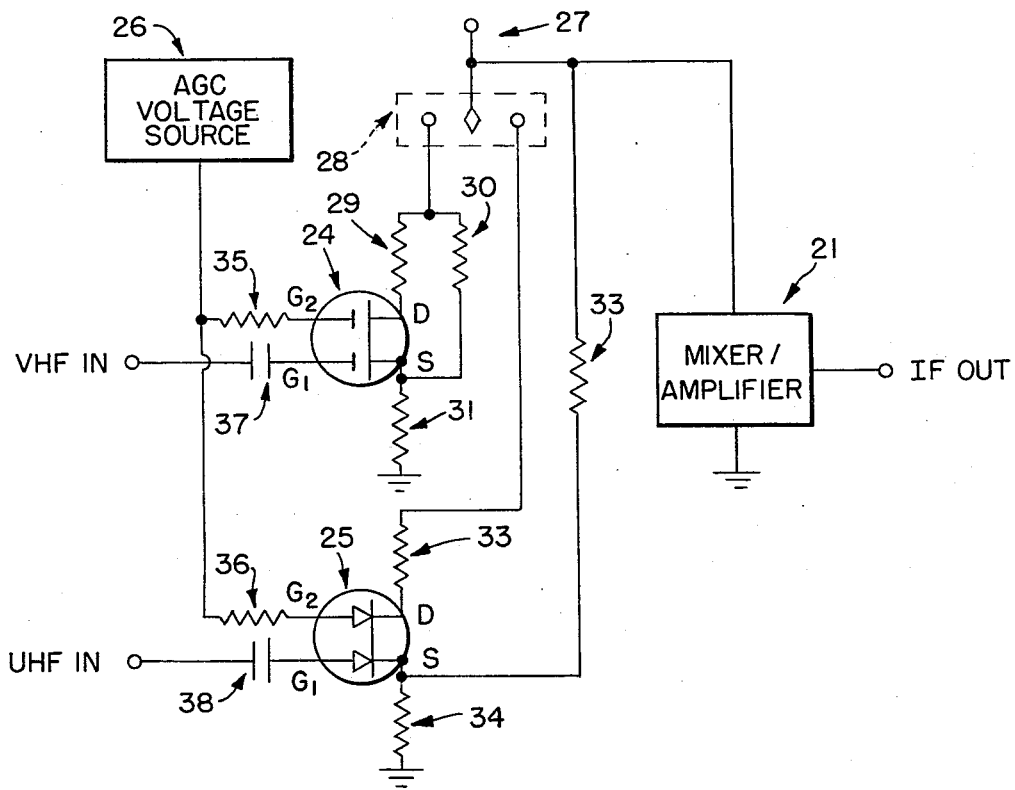
FIG. 4 is a circuit diagram of RF amplifiers according to the present invention.

FIG. 4 shows a circuit diagram of a TV tuner circuit in accordance with the present invention. The resistor 33 is separated from the drain of the dual-gate MES FET 25 and to always connected with the power supply source 27 in FIG. 4. In this case, an optimum DC bias voltage can be applied to the source (S) of the dual-gate MES FET 25 through resistors 33 and 34 in receiving VHF signals. Then, the voltage between the source (S) and the second gate ($G_2$) of the dual-gate MES FET 25 can always be maintained at a value which is lower than its limit value. Therefore, a DC current does not flow through the resistor 36 from the AGC voltage source 26 to the second gate (G₂) of the dual-gate MES FET 25 and the AGC voltage applied to the second gate (G₂) of the dual-gate MOS FET 24 is not reduced by the internal resistance of the AGC voltage source 26 in the VIF circuit.

Figure 5:
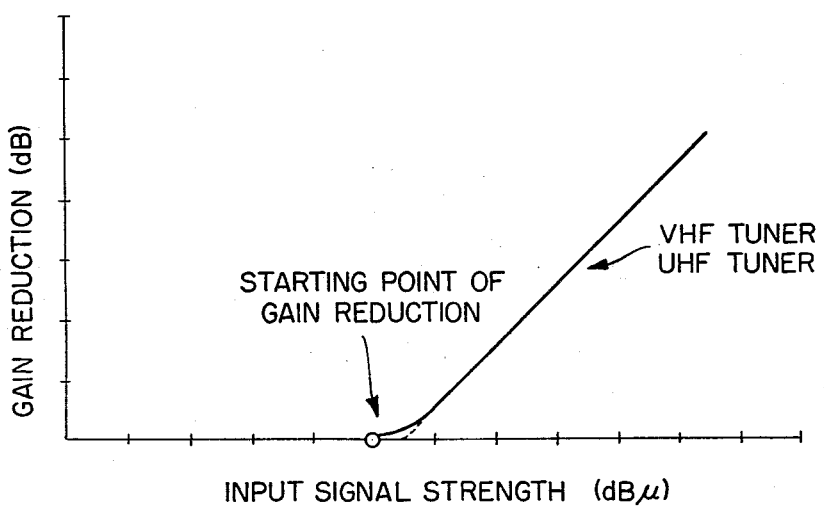
FIG. 5 is a graph showing the gain reduction characteristics of a TV tuner circuit according to the present invention.

FIG. 5 illustrates the gain reduction characteristics of the TV tuner circuit in FIG. 4. The gain reduction characteristics of the UHF tuner coincide with those of the VHF tuner. The gain reduction of the VHF tuner starts at the same signal strength as that of the UHF tuner. As is apparent from the foregoing description, in the TV tuner circuit of this invention, the gain reduction characteristics of a tuner circuit including a dual-gate MES FET in the UHF RF amplifier and a dual-gate MOS FET in the VHF RF amplifier can be optimized by a very simple adjustment in the VIF circuit.

What is claimed is:

1. A TV tuner circuit comprising: a VHF RF amplifier having a MOS FET with first and second gates, a source and a drain, said first gate thereof being coupled to a VHF signal input terminal; a UHF RF amplifier having a MES FET with first and second gates, a source and a drain, said first gate thereof being coupled to a UHF signal input terminal; a switch means having a common terminal, a first terminal for selecting VHF signal receiving and a second terminal for selecting UHF signal receiving; a mixer for converting either VHF RF signal or UHF RF signal into an IF signal; an AGC voltage source coupled to said respective second gates of said MOS FET and said MES FET through resistors; a DC source voltage input terminal connected to said common terminal of said switch means and to an input terminal of said mixer; and an IF signal output terminal connected to an output terminal of said mixer; wherein said source and drain of said MOS FET are connected to said first terminal of said switch means through resistors, and said drain of said MES FET is connected to said second terminal of said switch means; and wherein said respective sources of said MOS FET and said MES FET and connected to ground through resistors, and said source of said MES FET is connected to said DC source voltage input terminal through a resistor.

* * * * *